(12) United States Patent
Lee et al.

(10) Patent No.: US 8,664,654 B2
(45) Date of Patent: Mar. 4, 2014

(54) THIN FILM TRANSISTOR AND THIN FILM TRANSISTOR ARRAY PANEL INCLUDING THE SAME

(75) Inventors: Yong Su Lee, Hwaseong-si (KR); Yoon Ho Khang, Yongin-si (KR); Dong Jo Kim, Yongin-si (KR); Hyun Jae Na, Seoul (KR); Sang Ho Park, Suwon-si (KR); Se Hwan Yu, Seoul (KR); Chong Sup Chang, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/553,418

(22) Filed: Jul. 19, 2012

(65) Prior Publication Data

US 2013/0256652 A1    Oct. 3, 2013

(30) Foreign Application Priority Data

Apr. 2, 2012  (KR) .................. 10-2012-0034099

(51) Int. Cl.
*H01L 29/12*    (2006.01)
(52) U.S. Cl.
USPC .................................... 257/43; 257/E27.111
(58) Field of Classification Search
CPC ................ H01L 27/1214; H01L 27/12; H01L 29/66757
USPC .................................. 257/43, 66, 72, E27.111
See application file for complete search history.

(56) References Cited

U.S. PATENT DOCUMENTS

| | | | |
|---|---|---|---|
| 7,649,205 B2 | 1/2010 | Lujan et al. | |
| 2009/0283763 A1* | 11/2009 | Park et al. | 257/43 |
| 2011/0272696 A1* | 11/2011 | Ryu et al. | 257/59 |
| 2012/0223308 A1* | 9/2012 | Okabe et al. | 257/43 |

FOREIGN PATENT DOCUMENTS

| | | | | |
|---|---|---|---|---|
| KR | 1020120034982 A | | 4/2012 | |
| WO | WO 2011/045960 | * | 4/2011 | ............ H01L 29/786 |

* cited by examiner

*Primary Examiner* — Nikolay Yushin
(74) *Attorney, Agent, or Firm* — F. Chau & Associates, LLC

(57) ABSTRACT

A thin film transistor, a thin film transistor array panel including the same, and a method of manufacturing the same are provided, wherein the thin film transistor includes a channel region including an oxide semiconductor, a source region and a drain region connected to the channel region and facing each other at both sides with respect to the channel region, an insulating layer positioned on the channel region, and a gate electrode positioned on the insulating layer, wherein an edge boundary of the gate electrode and an edge boundary of the channel region are substantially aligned.

13 Claims, 19 Drawing Sheets

THIN FILM TRANSISTOR AND THIN FILM TRANSISTOR ARRAY PANEL INCLUDING THE SAME

CROSS-REFERENCE TO RELATED APPLICATION

This application claims priority to Korean Patent Application No. 10-2012-0034099 filed in the Korean Intellectual Property Office on Apr. 2, 2012, the entire contents of which are herein incorporated by reference.

TECHNICAL FIELD

Embodiments of the present invention relate to a thin film transistor, a thin film transistor array panel including the same, and a method of manufacturing the same.

DISCUSSION OF THE RELATED ART

Thin film transistors (TFTs) are used in various electronic devices, such as flat panel displays. For example, thin film transistors are used as switching elements or driving elements in a flat panel display, such as a liquid crystal display (LCD), an organic light emitting diode (OLED) display, and an electrophoretic display.

A thin film transistor includes a gate electrode connected to a gate line to transmit a scanning signal, a source electrode connected to a data line to transmit a signal applied to a pixel electrode, a drain electrode that faces the source electrode, and a semiconductor electrically connected to the source electrode and the drain electrode.

The semiconductor is a factor in determining characteristics of the thin film transistor. The semiconductor may include silicon (Si). The silicon may be amorphous silicon or polysilicon according to a crystallization type thereof. Amorphous silicon allows for a simpler manufacturing process and has relatively low charge mobility. Polysilicon, which has relatively high charge mobility, is subjected to a crystallizing process, such that manufacturing cost is increased and the process is complicated.

To address the properties of amorphous silicon and polysilicon, there is research on thin film transistors using an oxide semiconductor having high uniformity. The oxide semiconductor can have higher electron mobility, a higher ON/OFF ratio, and a lower cost than those of amorphous silicon and/or polysilicon.

If parasitic capacitance is generated between the gate electrode and the source electrode or the drain electrode of a thin film transistor, characteristics of the thin film transistor as a switching element may be deteriorated.

SUMMARY

Embodiments of the present invention improve characteristics of a thin film transistor including an oxide semiconductor.

A thin film transistor according to an exemplary embodiment of the present invention includes a channel region including an oxide semiconductor, a source region and a drain region respectively connected to two opposite sides of the channel region, wherein the source region and the drain region face each other, an insulating layer on the channel region, and a gate electrode on the insulating layer, wherein an edge of the gate electrode is aligned or substantially aligned with an edge of the channel region.

A thin film transistor array panel according to an exemplary embodiment of the present invention includes an insulation substrate, a channel region on the insulation substrate, the channel region including an oxide semiconductor, a source region and a drain region respectively connected to two opposite sides of the channel region, wherein the source region and the drain region face each other, an insulating layer on the channel region, and a gate electrode on the insulating layer, wherein an edge of the gate electrode is aligned or substantially aligned with an edge of the channel region.

The source region and the drain region may include a reduced material of the channel region.

The edge of the gate electrode is aligned or substantially aligned with an edge of the insulating layer.

A buffer layer may be further positioned between the insulation substrate and the channel region.

At least one of the buffer layer or the insulating layer may include an insulating oxide.

A method of manufacturing a thin film transistor according to an exemplary embodiment of the present invention includes forming a semiconductor pattern including an oxide semiconductor material, forming an insulating layer and a gate electrode that traverse each other and overlap the semiconductor pattern, and performing a reduction process on the semiconductor pattern that is not covered by the insulating layer and the gate electrode to form a channel region covered by the gate electrode and to form a source region and a drain region facing each other with respect to the channel region.

Forming the insulating layer and the gate electrode may include forming an insulating material layer including an insulating material on the semiconductor pattern, forming the gate electrode on the insulating material layer, and patterning the insulating material layer by using the gate electrode as an etching mask to form the insulating layer and to expose a portion of the semiconductor pattern.

Forming the semiconductor pattern and the forming of the insulating layer and the gate electrode may include sequentially depositing a semiconductor material layer including an oxide semiconductor material, an insulating material layer including an insulating material, and a gate layer including a conductive material, sequentially etching the gate layer, the insulating material layer, and the semiconductor material layer by using a photomask to form the semiconductor pattern, and etching the gate layer and the insulating material layer to expose a portion of the semiconductor pattern.

Forming of the semiconductor pattern and the etching of the gate layer and the insulating material layer to expose the portion of the semiconductor pattern may include forming a first photosensitive film pattern including a first portion and a second portion that is thinner than the first portion on the gate layer, sequentially etching the gate layer, the insulating material layer, and the semiconductor material layer by using the first photosensitive film pattern as an etching mask to form a gate pattern, an insulating pattern, and the semiconductor pattern, removing the second portion of the first photosensitive film pattern to form a second photosensitive film pattern, and etching the gate pattern and the insulating pattern by using the second photosensitive film pattern as an etching mask to expose a portion of the semiconductor pattern.

A method of manufacturing a thin film transistor array panel according to an exemplary embodiment of the present invention includes depositing a semiconductor material layer including an oxide semiconductor material on an insulation substrate and patterning the semiconductor material layer to form a semiconductor pattern, depositing an insulating material on the semiconductor pattern to form an insulating material layer, forming a gate electrode on the insulating material layer, patterning the insulating material layer by using the gate electrode as an etching mask to form an insulating layer and to expose a portion of the semiconductor pattern, and performing a reduction process on the exposed portion of the semiconductor pattern to form a channel region covered by the gate electrode and to form a source region and a drain region facing each other with respect to the channel region.

Forming the channel region, the source region, and the drain region may include a reduction treatment method using plasma.

The method may include forming a buffer layer including an insulating oxide on the insulation substrate before forming the semiconductor pattern.

Forming the channel region, the source region, and the drain region may include extracting a metal component of the oxide semiconductor material to a surface of at least one of the source region and the drain region.

A method of manufacturing a thin film transistor array panel according to an exemplary embodiment of the present invention includes sequentially forming a semiconductor material layer including an oxide semiconductor material, an insulating material layer including an insulating material, and a gate layer including a conductive material, forming a first photosensitive film pattern including a first portion and a second portion that is thinner than the first portion on the gate layer, sequentially etching the gate layer, the insulating material layer, and the semiconductor material layer by using the first photosensitive film pattern as an etching mask to form a gate pattern, an insulating pattern, and a semiconductor pattern, removing the second portion of the first photosensitive film pattern to form a second photosensitive film pattern, etching the gate pattern and the insulating pattern by using the second photosensitive film pattern as an etching mask to expose a portion of the semiconductor pattern, and performing a reduction process on the exposed portion of the semiconductor pattern to form a channel region covered by the gate electrode and to form a source region and a drain region facing each other with respect to the channel region.

The first portion and the second portion may be connected to each other.

Forming the channel region, the source region, and the drain region may include a reduction treatment method using plasma.

Forming the channel region, the source region, and the drain region may include extracting a metal component of the oxide semiconductor material to a surface of at least one of the source region and the drain region.

According to an embodiment, there is provided a thin film transistor including a substrate, a semiconductor pattern including a source region, a drain region, and a channel region between the source region and the drain region, and a gate electrode on the semiconductor pattern, wherein the gate electrode overlaps the channel region but does not overlap the source region or the drain region.

The thin film transistor may further include a light blocking film between the substrate and the semiconductor pattern, wherein the semiconductor pattern overlaps the light blocking film.

According to the exemplary embodiments of the present invention, the parasitic capacitance between the gate electrode and a source region or a drain region of a semiconductor layer of a thin film transistor may be reduced such that the characteristics of the thin film transistor may be improved.

DETAILED DESCRIPTION OF THE EMBODIMENTS

Figure 1A:
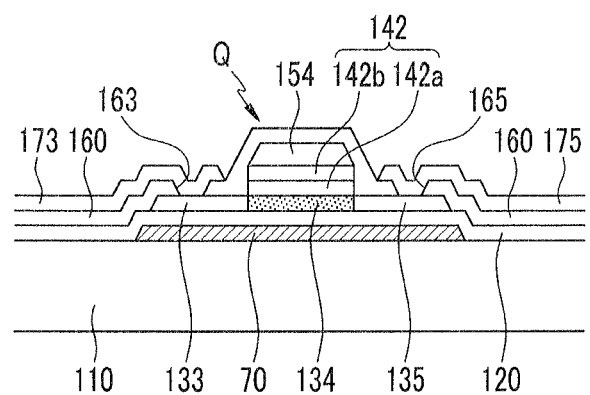
FIG. 1A is a cross-sectional view illustrating a thin film transistor array panel including a thin film transistor according to an exemplary embodiment of the present invention.

The embodiments of the present invention will be hereinafter described in greater detail with reference to the accompanying drawings. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals may designate like or similar elements throughout the specification and the drawings. It will be understood that when an element such as a layer, film, region, or substrate is referred to as being "on", "connected to", or "coupled to" another element, it can be directly on, connected or coupled to the other element or intervening elements may also be present.

As used herein, the singular forms, "a", "an", and "the" are intended to include the plural forms as well, unless the context clearly indicates otherwise.

As will be appreciated by one skilled in the art, embodiments of the present invention may be embodied as a system, method, computer program product, or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain, or store a program for use by or in connection with an instruction execution system, apparatus, or device.

Figure 1B:
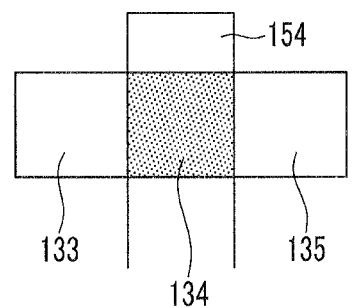
FIG. 1B is a plan view of the thin film transistor array panel of FIG. 1A, FIG. 2, FIG. 3, FIG. 4, FIG. 5, FIG. 6, FIG. 7, FIG. 8, FIG. 9, and FIG. 10 are cross-sectional views sequentially showing a method of manufacturing the thin film transistor array panel shown in FIG. 1 according to an exemplary embodiment of the present invention.

FIG. 1A is a cross-sectional view illustrating a thin film transistor array panel including a thin film transistor according to an exemplary embodiment of the present invention, and FIG. 1B is a plan view of the thin film transistor array panel of FIG. 1A.

Referring to FIG. 1A, a light blocking film 70 is positioned on an insulation substrate 110 made of glass or plastic. The light blocking film 70 prevents or inhibits light from reaching an oxide semiconductor included in a channel region to thereby prevent the oxide semiconductor from losing its characteristics. According to an embodiment, the light blocking film 70 is made of a material that does not transmit light of a predetermined wavelength band so that light does not reach the oxide semiconductor. According to an embodiment, the light blocking film 70 is made of an organic insulating material, an inorganic insulating material, or a conductive material, such as a metal, and according to an embodiment, includes a single layer or multiple layers.

According to an embodiment, the light blocking film 70 is omitted. For example, when there is no light irradiation from under the insulation substrate 110, for example, when the thin film transistor according to an exemplary embodiment of the present invention is used for an organic light emitting device, the light blocking film 70 is omitted.

A buffer layer 120 is positioned on the light blocking film 70. According to an embodiment, the buffer layer 120 includes an insulating oxide, such as silicon oxide (SiOx), aluminum oxide ($Al_2O_3$), hafnium oxide ($HfO_3$), and yttrium oxide ($Y_2O_3$). The buffer layer 120 prevents an impurity from the insulation substrate 110 from flowing into a semiconductor to be deposited later, thereby protecting the semiconductor and improving an interface characteristic of the semiconductor. A thickness of the buffer layer 120 is in a range of more than about 500 µm to less than about 1 µm, but is not limited thereto.

A semiconductor layer including a channel region 134, a source region 133, and a drain region 135 is formed on the buffer layer 120.

The semiconductor layer includes an oxide semiconductor material. The oxide semiconductor material includes a metal oxide semiconductor made of a metal oxide of zinc (Zn), indium (In), gallium (Ga), tin (Sn), or titanium (Ti), or a combination of the metal of zinc (Zn), indium (In), gallium (Ga), tin (Sn), titanium (Ti), and the metal oxide thereof. For example, according to an embodiment, the oxide semiconductor material includes at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The channel region 134 overlaps the light blocking film 70.

Referring to FIGS. 1A and 1B, the source region 133 and the drain region 135 are respectively positioned at two sides of the channel region 134 and are separated from each other. The source region 133 and the drain region 135 are connected to the channel region 134.

The source region 133 and the drain region 135 have conductivity and include a semiconductor material forming the channel region 134 and a reduced semiconductor material of the channel region 134. A metal, such as indium (In), included in the semiconductor material may be extracted to a surface of at least one of the source region 133 and the drain region 135.

An insulating layer 142 is positioned on the channel region 134. The insulating layer 142 covers the channel region 134. The insulating layer 142 does not overlap or substantially does not overlap the source region 133 or the drain region 135.

According to an embodiment, the insulating layer 142 includes a single-layered structure or a multilayered structure having at least two layers.

When the insulating layer 142 includes a single-layered structure, the insulating is layer 142 includes an insulating oxide, such as silicon oxide (SiOx), aluminum oxide ($Al_2O_3$), hafnium oxide ($HfO_3$), and yttrium oxide ($Y_2O_3$). The insulating layer 142 improves interface characteristics of the channel region 134 and prevents an impurity from penetrating into the channel region 134.

When the insulating layer 142 includes a multilayered structure, the insulating layer 142 includes a lower layer 142a and an upper layer 142b as shown in FIG. 1A. The lower layer 142a includes an insulating oxide, such as silicon oxide (SiOx), aluminum oxide ($Al_2O_3$), hafnium oxide ($HfO_3$), and yttrium oxide ($Y_2O_3$), such that the interface characteristic of the channel region 134 may be improved and the penetration of the impurity into the channel region 134 may be prevented. According to an embodiment, the upper layer 142b is made of various insulating materials, such as silicon nitride (SiNx) and silicon oxide (SiOx). For example, according to an embodiment, the insulating layer 142 includes a lower layer of aluminum oxide (AlOx), which has, but is not limited to, a thickness of less than about 500 Å, and an upper layer of silicon oxide (SiOx), which has, but is not limited to, a thickness of more than about 500 Å to less than about 1500 Å. Alternatively, the insulating layer 142 includes a lower layer of silicon oxide (SiOx), which has, but is not limited to, a thickness of about 2000 Å, and an upper layer of silicon nitride (SiNx), which has, but is not limited to, a thickness of about 1000 Å.

According to an embodiment, a thickness of the insulating layer 142 is more than 1000 Å to less than 5000 Å, but is not limited thereto. An entire thickness of the insulating layer 142 is controlled to maximize the characteristics of the thin film transistor.

A gate electrode 154 is positioned on the insulating layer 142. An edge of the gate electrode 154 and an edge of the insulating layer 142 are aligned or substantially aligned with each other.

Referring to FIGS. 1A and 1B, the gate electrode 154 includes a portion overlapping the channel region 134, and the channel region 134 is covered by the gate electrode 154. The source region 133 and the drain region 135 are positioned at two sides of the channel region 134 with respect to the gate electrode 154, and the source region 133 and the drain region 135 do not overlap or do not substantially overlap the gate electrode 154. Accordingly, the parasitic capacitance between the gate electrode 154 and the source region 133 or the parasitic capacitance between the gate electrode 154 and the drain region 135 may be decreased.

According to an embodiment, the gate electrode 154 is made of a metal, such as aluminum (Al), silver (Ag), copper (Cu), molybdenum (Mo), chromium (Cr), tantalum (Ta), and titanium (Ti), or alloys thereof. The gate electrode 154 has a single-layered or multilayered structure. According to an embodiment, the multilayered structure includes a double-layered structure including a lower layer of titanium (Ti), tantalum (Ta), molybdenum (Mo), or ITO and an upper layer of copper (Cu). According to an embodiment, when the gate electrode includes a multilayered structure, the gate electrode includes a triple-layered structure of molybdenum (Mo)-aluminum (Al)-molybdenum (Mo). According to an embodiment, the gate electrode 154 is made of various metals or conductors.

According to an exemplary embodiment of the present invention, a boundary between the channel region 134 and the source region 133 or a boundary between the channel region 134 and the drain region 135 are aligned or substantially aligned with an edge of the gate electrode 154 or the insulating layer 142. Alternatively, the boundary between the channel region 134 and the source region 133 or the drain region 135 is positioned more inwardly with respect to the edge of the gate electrode 154 or the insulating layer 142.

The gate electrode 154, the source region 133, and the drain region 135 form a thin film transistor (TFT) Q along with the channel region 134, and a channel of the thin film transistor is formed in the channel region 134.

A passivation layer 160 is positioned on the gate electrode 154, the source region 133, the drain region 135, and the buffer layer 120. According to an embodiment, the passivation layer 160 is made of an inorganic insulating material, such as silicon nitride or silicon oxide, or an organic insulating material. The passivation layer 160 has a contact hole 163 exposing the source region 133 and a contact hole 165 exposing the drain region 135.

A data input electrode 173 and a data output electrode 175 are positioned on the passivation layer 160. The data input electrode 173 is also referred to as a source electrode, and the data output electrode 175 is also referred to as a drain electrode The data input electrode 173 is electrically connected to the source region 133 of the thin film transistor Q through the contact hole 163 of the passivation layer 160, and the data output electrode 175 is electrically connected to the drain region 135 of the thin film transistor Q through the contact hole 165 of the passivation layer 160.

Alternatively, a color filter (not shown) or an organic layer (not shown) made of an organic material is further positioned on the passivation layer 160, and the data input electrode 173 and the data output electrode 175 are positioned on the color filter or organic layer. Alternatively, at least one of the data input electrode 173 and the data output electrode 175 is omitted.

A method of manufacturing the thin film transistor array panel shown in FIG. 1 according to an exemplary embodiment of the present invention is described with reference to FIG. 2 to FIG. 9 as well as FIG. 1.

FIG. 2, FIG. 3, FIG. 4, FIG. 5, FIG. 6, FIG. 7, FIG. 8, FIG. 9, and FIG. 10 are cross-sectional views sequentially showing a method of manufacturing the thin film transistor array panel shown in FIG. 1 according to an exemplary embodiment of the present invention.

Figure 2:
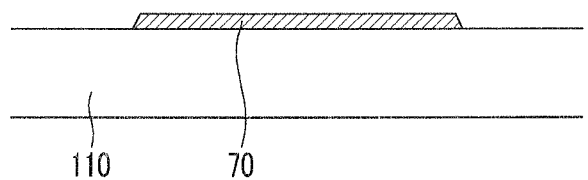

Referring to FIG. 2, the light blocking film 70 made of an organic insulating material, an inorganic insulating material, or a conductive material, such as a metal, is formed on the insulation substrate 110 made of glass or plastic. According to an embodiment, the forming of the light blocking film 70 is omitted according to the condition.

Figure 3:
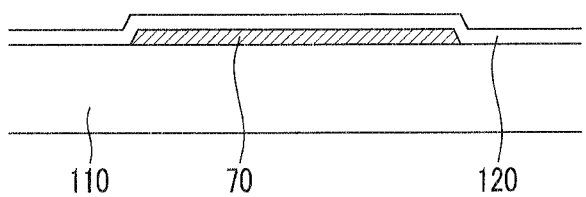

Referring to FIG. 3, the buffer layer 120 made of an insulating material including an oxide, such as silicon oxide (SiOx), aluminum oxide ($Al_2O_3$), hafnium oxide ($HfO_3$), and yttrium oxide ($Y_2O_3$), is formed on the light blocking film 70 by a chemical vapor deposition (CVD) method. A thickness of the buffer layer 120 is in a range more than about 500 μm to less than about 1 μm, but is not limited thereto.

Figure 4:
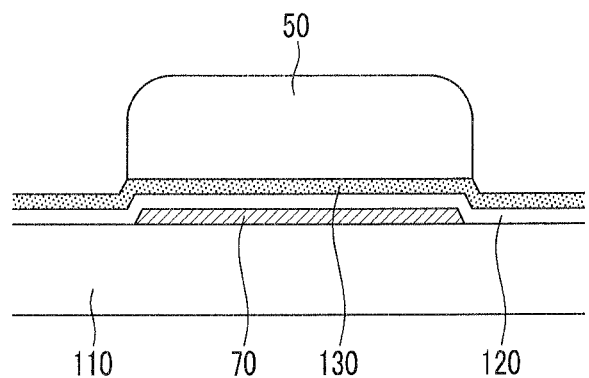

Referring to FIG. 4, a semiconductor material layer 130 made of an oxide semiconductor material, such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), is coated on the buffer layer 120.

A photosensitive film including a photoresist is coated on the semiconductor material layer 130 and is exposed to light, resulting in a photosensitive film pattern 50. The photosensitive film pattern 50 overlaps at least a portion of the light blocking film 70.

Figure 5:
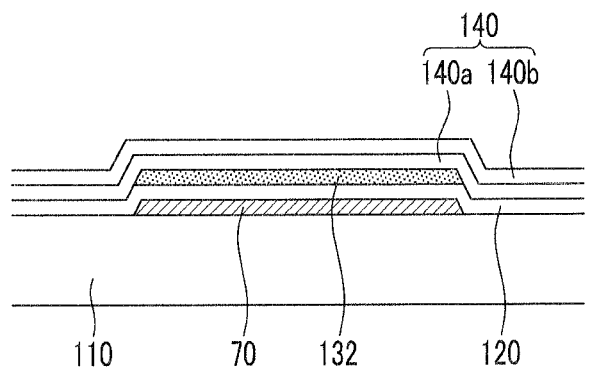

Referring to FIG. 5, the semiconductor material layer 130 is etched by using the photosensitive film pattern 50 as a mask to form a semiconductor pattern 132.

An insulating material layer 140 is formed on the semiconductor pattern 132 and the buffer layer 120. The insulating material layer 140 includes a single-layered structure including an insulating oxide of silicon oxide (SiOx), or as shown in FIG. 5, includes a multilayered structure including a lower layer 140a including an insulating oxide, such as silicon oxide (SiOx), and an upper layer 140b including an insulating material. A thickness of the insulating material layer 140 is more than about 1000 Å to less than about 5000 Å, but is not limited thereto.

Figure 6:
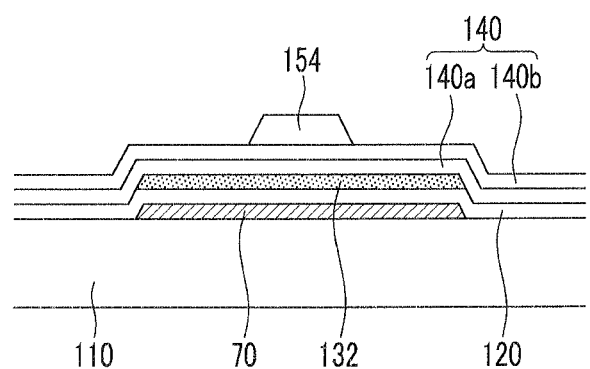

Referring to FIG. 6, a conductive material, such as a metal, is deposited on the insulating material layer 140 and is patterned to form the gate electrode 154. The gate electrode 154 is formed to traverse a center portion of the semiconductor pattern 132 such that two portions of the semiconductor pattern 132 respectively positioned at two sides of the overlapping portion of the gate electrode 154 and the semiconductor pattern 132 are not covered by the gate electrode 154.

Figure 7:
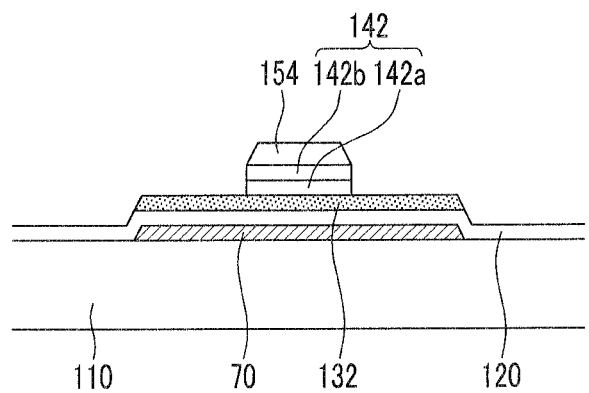

Referring to FIG. 7, the insulating material layer 140 is patterned by using the gate electrode 154 as an etching mask to form the insulating layer 142. According to an embodiment, the insulating layer 142 includes a single-layered structure or a multilayered structure that includes a lower layer 142a including an insulating oxide and an upper layer 142b including an insulating material.

Accordingly, the gate electrode 154 and the insulating layer 142 have the same or substantially the same plane shape. The two portions of the semiconductor pattern 132 that are not covered by the gate electrode 154 are exposed.

According to an embodiment, the method of patterning the insulating material layer 140 includes a dry etching method in which etching gas and etching time are controlled for the buffer layer 120 to not be etched.

Figure 8:
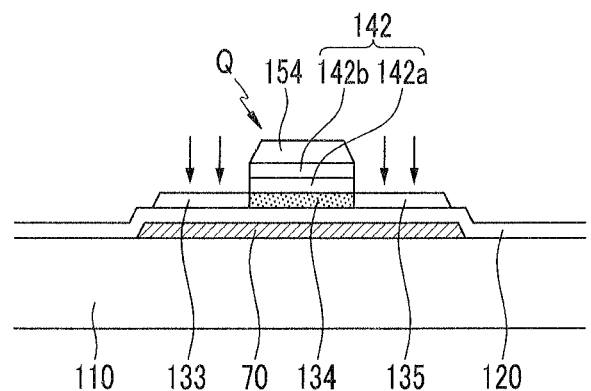

Referring to FIG. 8, the two exposed portions of the semiconductor pattern 132 are subjected to a reduction treatment method, thereby forming the source region 133 and the drain region 135 having conductivity. The semiconductor pattern 132 that is covered by the insulating layer 142 and is not reduced becomes a channel region 134. Accordingly, the gate electrode 154, the source region 133, and the drain region 135 form the thin film transistor Q along with the channel region 134.

According to an embodiment, the reduction treatment method includes a heat treatment method that is performed in a reduction atmosphere and a gas plasma treatment using plasma, such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen ($N_2$), nitrogen oxide ($N_2O$), and fluoroform ($CHF_3$). At least a portion of the semiconductor material forming the reduced and exposed semiconductor pattern 132 has only metallic bonding. Accordingly, the reduced semiconductor pattern 132 has conductivity.

In the reduction treatment of the semiconductor pattern 132, the metallic component of the semiconductor material, for example indium (In), is extracted to a surface of the semiconductor pattern 132. A thickness of the extracted metal layer is less than about 200 nm.

Figure 9:
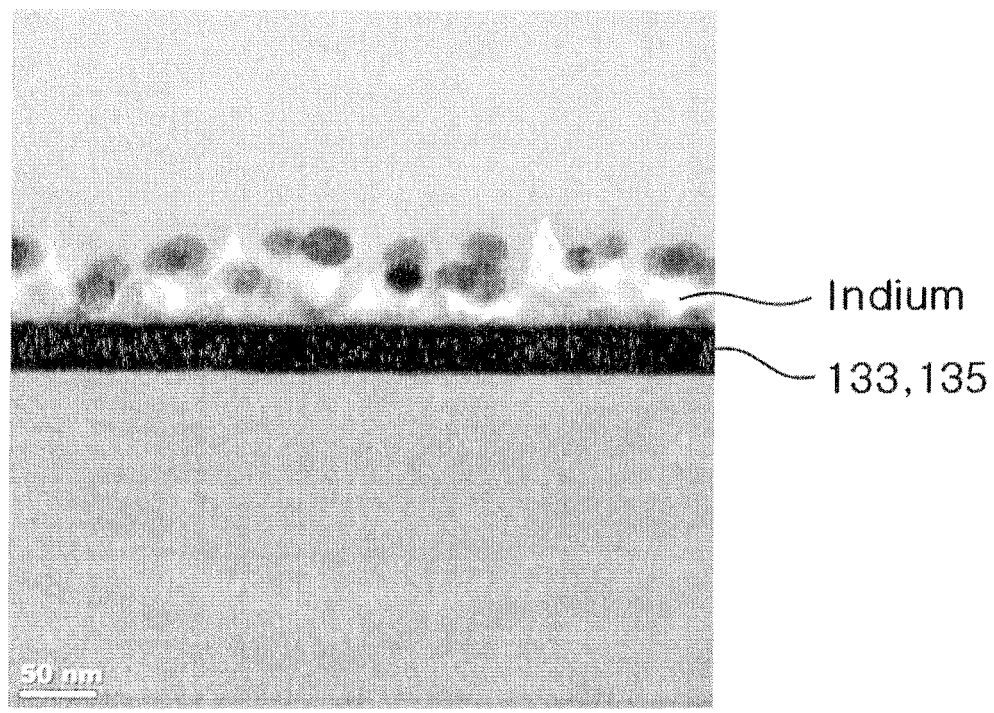

FIG. 9 shows an example of indium (In) particles extracted to the surface of the source region 133 and the drain region 135 when the semiconductor material forming the semiconductor pattern 132 includes indium (In).

According to an exemplary embodiment of the present invention, a boundary between the channel region 134 and the source region 133 or a boundary between the channel region 134 and the drain region 135 is aligned or substantially aligned with an edge of the gate electrode 154 or the insulating layer 142. However, in the reduction treatment of the semiconductor pattern 132, a portion of the semiconductor pattern 132 under the edge portion of the insulating layer 142 may be reduced such that the boundary between the channel region 134 and the source region 133 or the drain region 135 may be positioned more inwardly with respect to the edge of the gate electrode 154 or the insulating layer 142.

Figure 10:
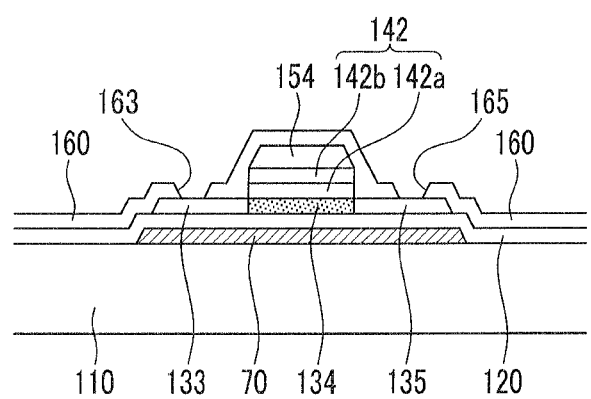

Referring to FIG. 10, an insulating material is coated on the gate electrode 154, the source region 133, the drain region 135, and the buffer layer 120, thus forming the passivation layer 160. The passivation layer 160 is patterned to form a contact hole 163 exposing the source region 133 and a contact hole 165 exposing the drain region 135.

As shown in FIG. 1, a data input electrode 173 and a data output electrode 175 are formed on the passivation layer 160.

In the thin film transistor Q according to an exemplary embodiment of the present invention, the gate electrode 154 and the source region 133 or the gate electrode 154 and the drain region 135 do not overlap or substantially do not overlap each other such that the parasitic capacitance between the gate electrode 154 and the source region 133 or between the gate electrode 154 and the drain region 135 may be decreased. Accordingly, the on/off characteristics of the thin film transistor Q as a switching element may be improved.

Figure 11:
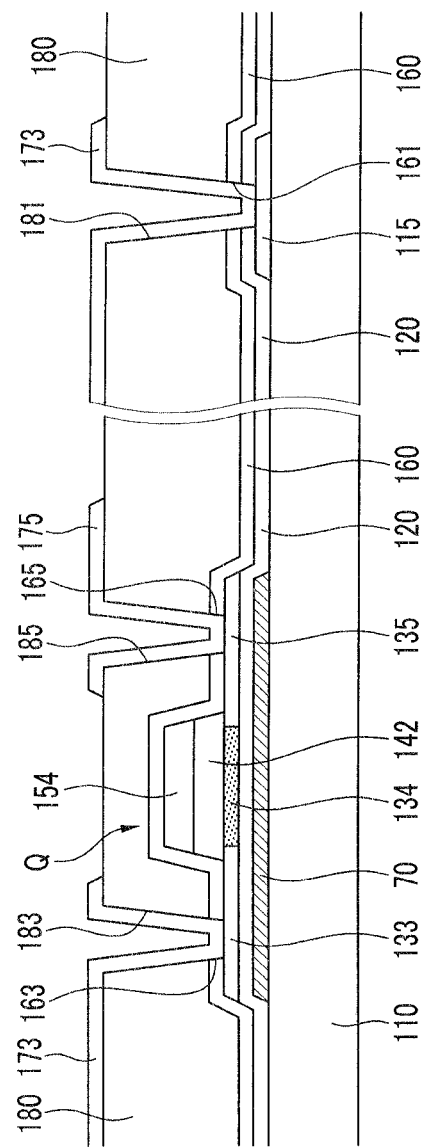
FIG. 11 is a cross-sectional view illustrating a thin film transistor array panel including a thin film transistor according to an exemplary embodiment of the present invention.

Referring to FIG. 11, a thin film transistor and a thin film transistor array panel according to an exemplary embodiment of the present invention are described.

FIG. 11 is a cross-sectional view including a thin film transistor array panel including a thin film transistor according to an exemplary embodiment of the present invention.

Referring to FIG. 11, a light blocking film 70 is positioned on an insulation substrate 110. The light blocking film 70 prevents light from reaching a semiconductor included in the channel region 134 such that the semiconductor does not lose its characteristics. According to an embodiment, the light blocking film 70 is made of a material that does not transmit light of a predetermined wavelength band so that light does not reach the semiconductor. According to an embodiment, the light blocking film 70 is made of an organic insulating material, an inorganic insulating material, or a conductive material, such as a metal, and according to an embodiment, includes a single layer or multiple layers.

A data line 115 through which a data signal is transmitted is positioned on the insulation substrate 110. According to an embodiment, the data line 115 is made of a conductive material including metal, such as, e.g., aluminum (Al), silver (Ag), copper (Cu), molybdenum (Mo), chromium (Cr), tantalum (Ta), and titanium (Ti), or alloys thereof.

A buffer layer 120 is positioned on the light blocking film 70 and the data line 115.

A semiconductor layer including a channel region 134, a source region 133, and a drain region 135 is formed on the buffer layer 120.

The channel region 134 includes an oxide semiconductor material. When the light blocking film 70 is provided, the channel region 134 overlaps the light blocking film 70.

The source region 133 and the drain region 135 are positioned at two sides of the channel region 134. The source region 133 and the drain region 135 face each other and are separated from each other with the channel region 134 positioned between the source region 133 and the drain region 135. The source region 133 and the drain region 135 are connected to the channel region 134.

An insulating layer 142 is positioned on the channel region 134. The insulating layer 142 covers the channel region 134. According to an embodiment, the insulating layer 142 does not overlap or substantially does not overlap the source region 133 or the drain region 135. According to an embodiment, the insulating layer 142 has a single-layered structure or a multilayered structure. For example, according to an embodiment, the insulating layer 142 includes a single layer including a material, such as silicon oxide (SiOx) or silicon nitride (SiNx), or includes a lower layer of aluminum oxide ($Al_2O_3$) and an upper layer of silicon oxide (SiOx). According to an embodiment, the insulating layer 142 has the characteristics of the insulating layer 142 described in connection with FIGS. 1 to 10.

A gate electrode 154 is positioned on the insulating layer 142. An edge of the gate electrode 154 and an edge of the insulating layer 142 are aligned or substantially aligned with each other.

The gate electrode 154 includes a portion overlapping the channel region 134, and the channel region 134 is covered by the gate electrode 154. The source region 133 and the drain region 135 are positioned at two sides of the channel region 134 with respect to the gate electrode 154, and the source region 133 and the drain region 135 do not overlap or do not substantially overlap the gate electrode 154. Accordingly, the parasitic capacitance between the gate electrode 154 and the source region 133 or the parasitic capacitance between the gate electrode 154 and the drain region 135 may be decreased.

The gate electrode 154, the source region 133, and the drain region 135 form the thin film transistor Q along with the channel region 134.

A passivation layer 160 is positioned on the gate electrode 154, the source region 133, the drain region 135, and the buffer layer 120. The passivation layer 160 has a contact hole 163 exposing the source region 133 and a contact hole 165 exposing the drain region 135. The buffer layer 120 and the passivation layer 160 include a contact hole 161 exposing the data line 115.

An organic layer 180 is further positioned on the passivation layer 160. The organic layer 180 includes an organic insulating material or a color filter material. The organic layer 180 has a flat surface. The organic layer 180 includes a contact hole 183, which exposes the source region 133 and corresponds to the contact hole 163 of the passivation layer 160, a contact hole 185, which exposes the drain region 135 and corresponds to the contact hole 165 of the passivation layer 160, and a contact hole 181 which exposes the data line 115 and corresponds to the contact hole 161 of the passivation layer 160 and the buffer layer 120. As shown in FIG. 11, edges of the contact holes 183, 185, and 181 of the organic layer 180 are respectively aligned with edges of the contact holes 163, 165, and 161 of the passivation layer 160. Alternatively, the edges of the contact holes 163, 165, and 161 of the passivation layer 160 are respectively positioned in a further inward position than the edges of the contact holes 183, 185, and 181 of the organic layer 180. For example, the contact holes 163, 165, and 161 of the passivation layer 160 are respectively positioned within the contact holes 183, 185, and 181 of the organic layer 180 when seen in plan view.

A data input electrode 173, also referred to as a source electrode, and a data output electrode 175, also referred to as a drain electrode, are disposed on the organic layer 180. The data input electrode 173 is electrically connected to the source region 133 of the thin film transistor Q through the contact hole 163 of the passivation layer 160 and the contact hole 183 of the organic layer 180, and the data output electrode 175 is electrically connected to the drain region 135 of the thin film transistor Q through the contact hole 165 of the passivation layer 160 and the contact hole 185 of the organic layer 180. The data input electrode 173 is connected to the data line 115 through the contact hole 161 of the passivation layer 160 and the contact hole 181 of the organic layer 180. Accordingly, the source region 133 receives a data signal from the data line 115. According to an embodiment, the data output electrode 175 forms a pixel electrode that is used to control image display or the data output electrode 175 is connected to a separate pixel electrode (not shown).

A method of manufacturing the thin film transistor array panel shown in FIG. 11 according to an exemplary embodiment of the present invention is described with reference to FIG. 12 to FIG. 20 as well as FIG. 11.

Figure 12:
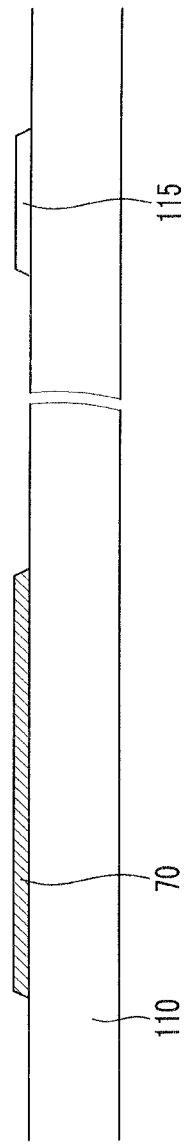
FIG. 12, FIG. 13, FIG. 14, FIG. 15, FIG. 16, FIG. 17, FIG. 18, FIG. 19, and FIG. 20 are cross-sectional views sequentially showing a method of manufacturing the thin film transistor array panel shown in FIG. 11 according to an exemplary embodiment of the present invention.

FIG. 12, FIG. 13, FIG. 14, FIG. 15, FIG. 16, FIG. 17, FIG. 18, FIG. 19 and FIG. 20 are cross-sectional views sequentially showing a method of manufacturing the thin film transistor array panel shown in FIG. 11 according to an exemplary embodiment of the present invention, Referring to FIG. 12, a light blocking film 70 made of an organic insulating material, an inorganic insulating material, or a conductive material, such as a metal, is formed on an insulation substrate 110 of glass or plastic. According to an embodiment, the formation of the light blocking film 70 is omitted according to the condition.

A metal is deposited and patterned on the insulation substrate 110 to thereby form a data line 115. According to an embodiment, the sequence of forming the light blocking film 70 and the data line 115 is changed. For example, the data line 115 is formed, and the light blocking film 70 is then formed.

Figure 13:
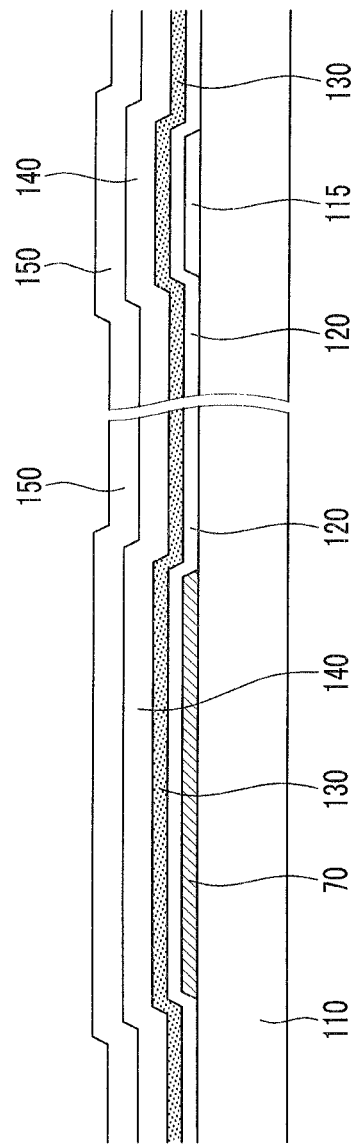

Referring to FIG. 13, a buffer layer 120, a semiconductor material layer 130, an insulating material layer 140, and a gate layer 150 are sequentially deposited on the light blocking film 70 and the data line 115.

The buffer layer 120 is formed by depositing an insulating oxide, such as silicon oxide (SiOx), aluminum oxide ($Al_2O_3$), hafnium oxide ($HfO_3$), and yttrium oxide ($Y_2O_3$). A thickness of the buffer layer 120 is in a range from more than about 500 μm to less than about 1 μm, but is not limited thereto.

The semiconductor material layer 130 is formed by depositing an oxide semiconductor material, such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The insulating material layer 140 is formed of an insulating material including an insulating oxide, such as silicon oxide (SiOx). According to an embodiment, the insulating material layer 140 includes a single-layered structure or a multilayered structure including a lower layer 140a including an oxide, such as silicon oxide (SiOx), and an upper layer 140b including an insulating material. A thickness of the insulating material layer 140 is in a range from more than about 1000 Å to less than about 5000 Å, but is not limited thereto.

The gate layer 150 is formed by depositing a conductive material, such as aluminum (Al).

Figure 14:
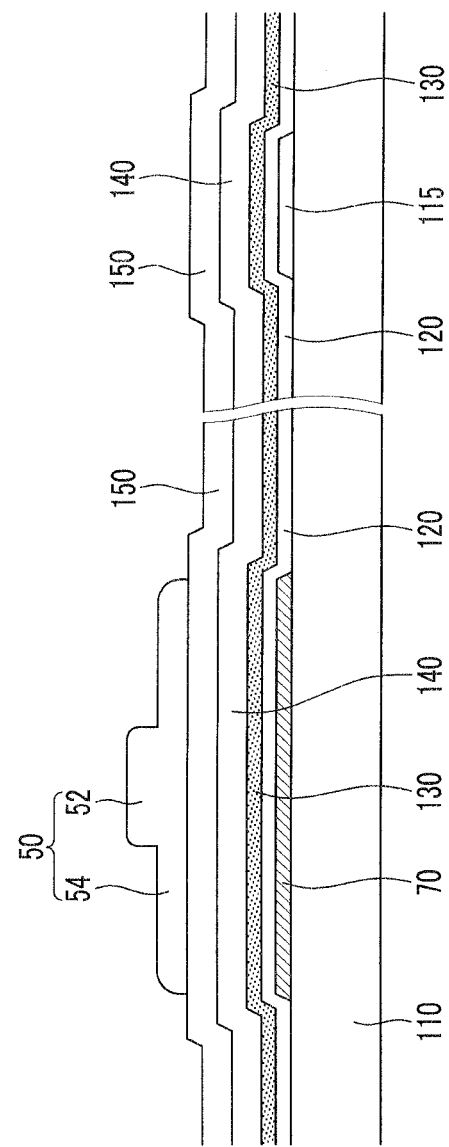

Referring to FIG. 14, a photosensitive film of a photoresist is coated on the gate layer 150 and is exposed to light, thereby forming the photosensitive film pattern 50. The photosensitive film pattern 50 includes, as shown in FIG. 14, a first portion 52 having a relatively large thickness and a second portion 54 having a relatively small thickness. The first portion 52 of the photosensitive film pattern 50 overlaps the light blocking film 70. Two sides of the second portion 54, which are separated and face each other with respect to the first portion 52, are respectively connected to two sides of the first portion 52 of the photosensitive film pattern 50.

The photosensitive film pattern 50 is formed by an exposing process using a photomask (not shown) including a transflective region. For example, the photomask for forming the photosensitive film pattern 50 includes a transmission region that transmits light, a light blocking region that blocks light, and a transflective region that transmits part of light. According to an embodiment, the transflective region is formed of a slit or a translucent layer.

When the exposing process is performed by using the photomask including the transflective region and using a negative photosensitive film, a portion corresponding to the transmission region of the photomask is irradiated with light such that the photosensitive film remains thereby forming the first portion 52 having a relatively large thickness, a portion corresponding to the light blocking region of the photomask is blocked from light irradiation such that the photosensitive film is removed, and a portion corresponding to the transflective region of the photomask is partially irradiated with light such that the second portion 54 having a relatively small thickness is formed. When a positive photosensitive film is used for the exposing process, a portion corresponding to the transmission region of the photomask is irradiated with light such that the photosensitive film is removed, a portion corresponding to the light blocking region of the photomask is blocked from light irradiation such that the photosensitive film remains thereby forming the first portion 52 having a relatively large thickness, and a portion corresponding to the transflective region of the photomask is partially irradiated with light such that the second portion 54 having a relatively small thickness is formed. As such, irrespective of whether a negative photosensitive film or positive photosensitive film is used for the exposing process, the portion corresponding to the transflective region of the photomask is subjected to partial light irradiation, thus resulting in the second portion 54 of the photosensitive film pattern 50.

Figure 15:
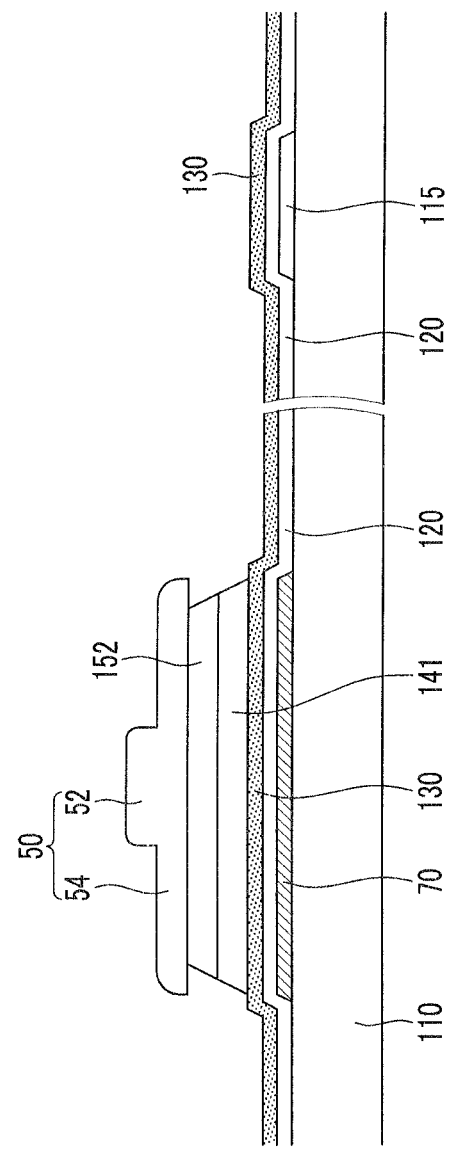

Referring to FIG. 15, the gate layer 150 and the insulating material layer 140 are sequentially etched by using the photosensitive film pattern 50 as an etching mask. According to an embodiment, the gate layer 150 is etched through a wet etching method, and the insulating material layer 140 is etched through a dry etching method. Accordingly, the gate pattern 152 and the insulating pattern 141 having the same plane shape are formed under the photosensitive film pattern 50. The semiconductor material layer 130 that is not covered by the photosensitive film pattern 50 is exposed.

Figure 16:
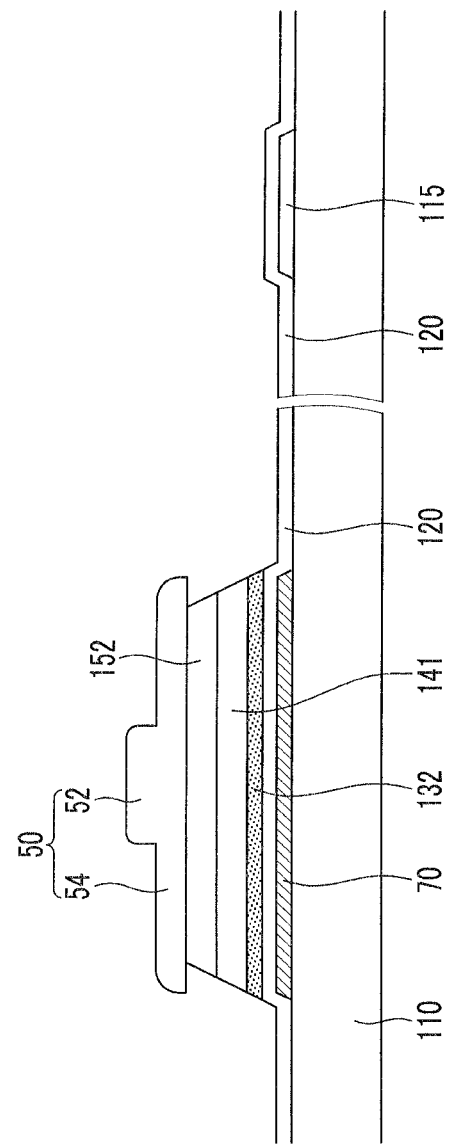

Referring to FIG. 16, the exposed semiconductor material layer 130 is removed by using the gate pattern 152 and the insulating pattern 141 as an etching mask to thereby form a semiconductor pattern 132. The semiconductor pattern 132 has the same plane shape as the gate pattern 152 and the insulating pattern 141.

Figure 17:
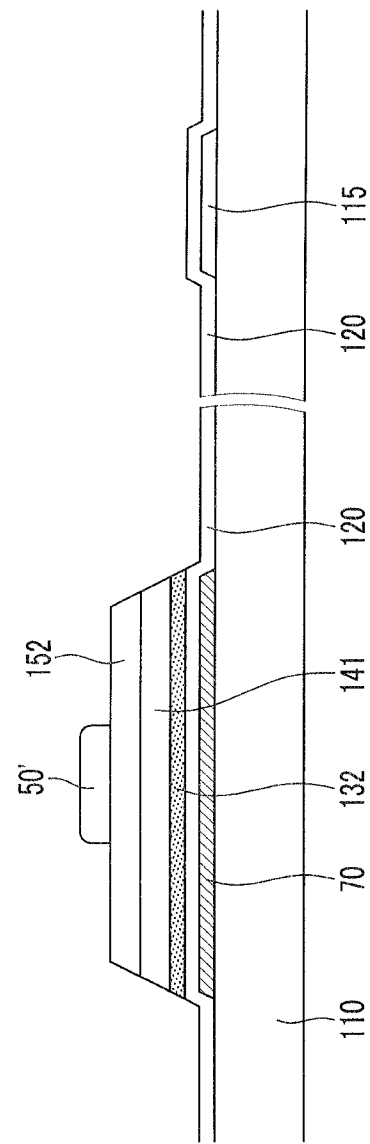

Referring to FIG. 17, the photosensitive film pattern 50 is etched through an ashing method using oxygen plasma so that the second portion 54 is removed and a thickness of the photosensitive film pattern 50 is reduced. Accordingly, the first portion 52 with the reduced thickness remains thereby resulting in a photosensitive film pattern 50'.

Figure 18:
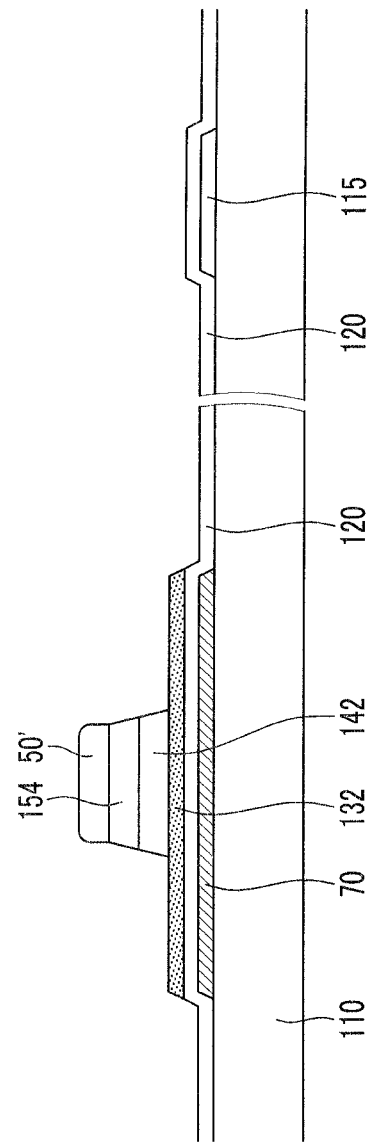

Referring to FIG. 18, the gate pattern 152 and the insulating pattern 141 are sequentially etched by using the photosensitive film pattern 50' as an etching mask. Accordingly, the semiconductor pattern 132 that is not covered by the photosensitive film pattern 50' is exposed. The exposed semiconductor pattern 132 is positioned at two sides of the semiconductor pattern 132 that is covered by the photosensitive film pattern 50'.

Figure 19:
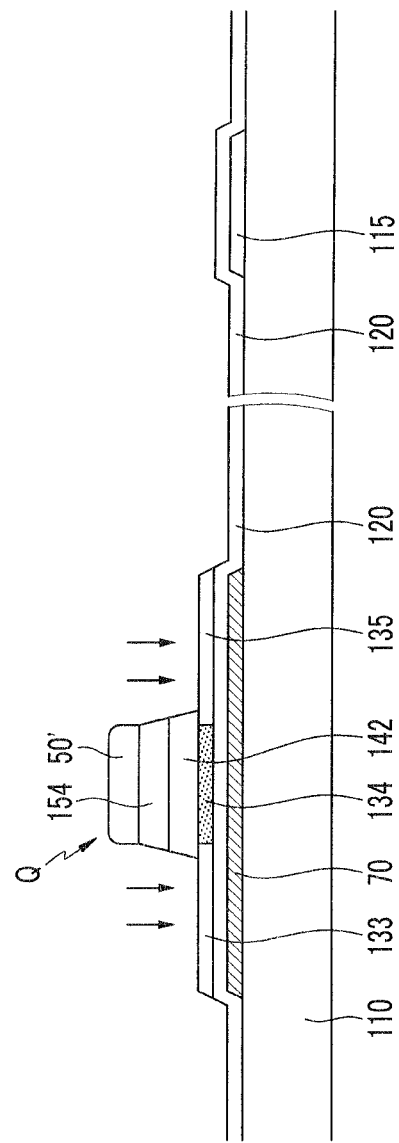

Referring to FIG. 19, the semiconductor pattern 132 undergoes a reduction treatment to thereby form the source region 133 and the drain region 135 having conductivity. The semiconductor pattern 132 covered by the insulating layer 142 is not reduced thereby forming the channel region 134.

The gate electrode 154, the source region 133, and the drain region 135 form the thin film transistor Q along with the channel region 134.

According to an embodiment, the reduction treatment method includes a heat treatment method that is performed in a reduction atmosphere and a gas plasma treatment using plasma, such as hydrogen ($H_2$), argon (Ar), nitrogen ($N_2$), nitrogen oxide ($N_2O$), and fluoroform ($CHF_3$). At least a portion of the semiconductor material forming the reduced and exposed semiconductor pattern 132 has only metallic bonding. Accordingly, the reduced semiconductor pattern 132 has conductivity.

In the reduction treatment of the semiconductor pattern 132, the metallic component of the semiconductor material, for example indium (In), is extracted to a surface of the semiconductor pattern 132. A thickness of the extracted metal layer is less than about 200 nm.

According to an exemplary embodiment of the present invention, a boundary between the channel region 134 and the source region 133 or a boundary between the channel region 134 and the drain region 135 is aligned or substantially aligned with an edge of the gate electrode 154 or the insulating layer 142. However, in the reduction treatment of the semiconductor pattern 132, a portion of the semiconductor pattern 132 under the edge portion of the insulating layer 142 may be reduced such that the boundary between the channel region 134 and the source region 133 or the drain region 135 may be positioned more inwardly with respect to the edge of the gate electrode 154 or the insulating layer 142.

Figure 20:
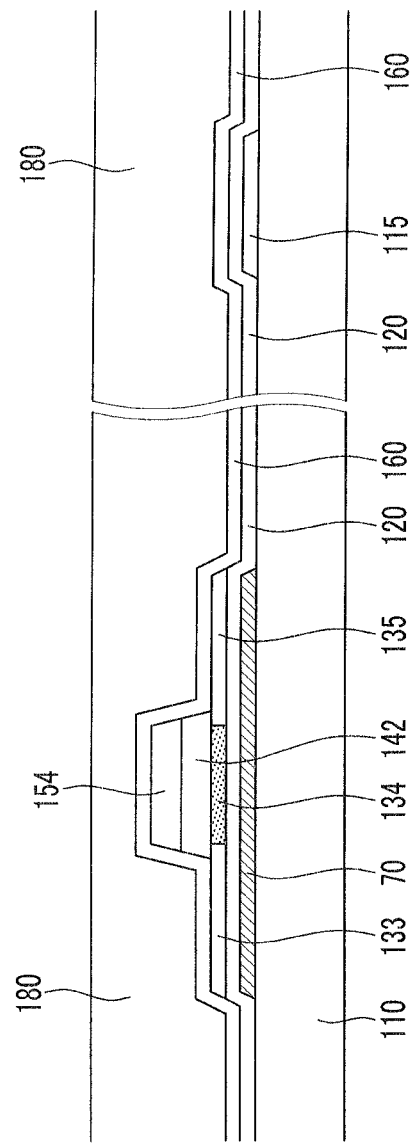

Referring to FIG. 20, after removing the photosensitive film pattern 50', an insulating material is coated on the gate electrode 154, the source region 133, the drain region 135, and the buffer layer 120 to thereby form a passivation layer 160. An organic insulating material is coated on the passivation layer 160, thus forming the organic layer 180.

As shown in FIG. 11, contact holes 163, 165, 161, 183, 185, and 181 are formed in the passivation layer 160 and the organic layer 180, and a data input electrode 173 and a data output electrode 175 are formed on the organic layer 180.

When forming the contact holes 163, 165, 161, 183, 185, and 181 in the passivation layer 160 and the organic layer 180, one or two masks are used. For example, the organic layer 180 is exposed by using one photomask to form the contact holes 183, 185, and 181 of the organic layer 180, and then contact holes 163, 165, and 161 of the passivation layer 160 are formed that, when viewed in plan view, are respectively positioned within the contact holes 183, 185, and 181 of the organic layer 180 by using another photomask. Edges of the contact holes 163, 165, and 161 of the passivation layer 160 are respectively aligned with edges of the contact holes 183, 185, and 181 of the organic layer 180.

Figure 21:
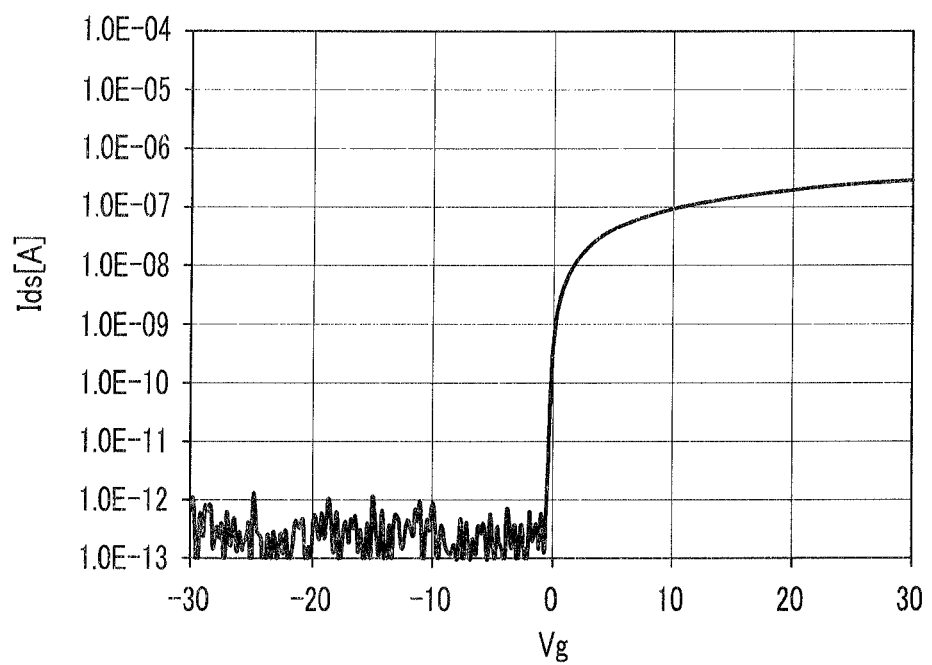
FIG. 21 is a graph illustrating a voltage-current characteristic of a thin film transistor according to an exemplary embodiment of the present invention.
Figure 22:
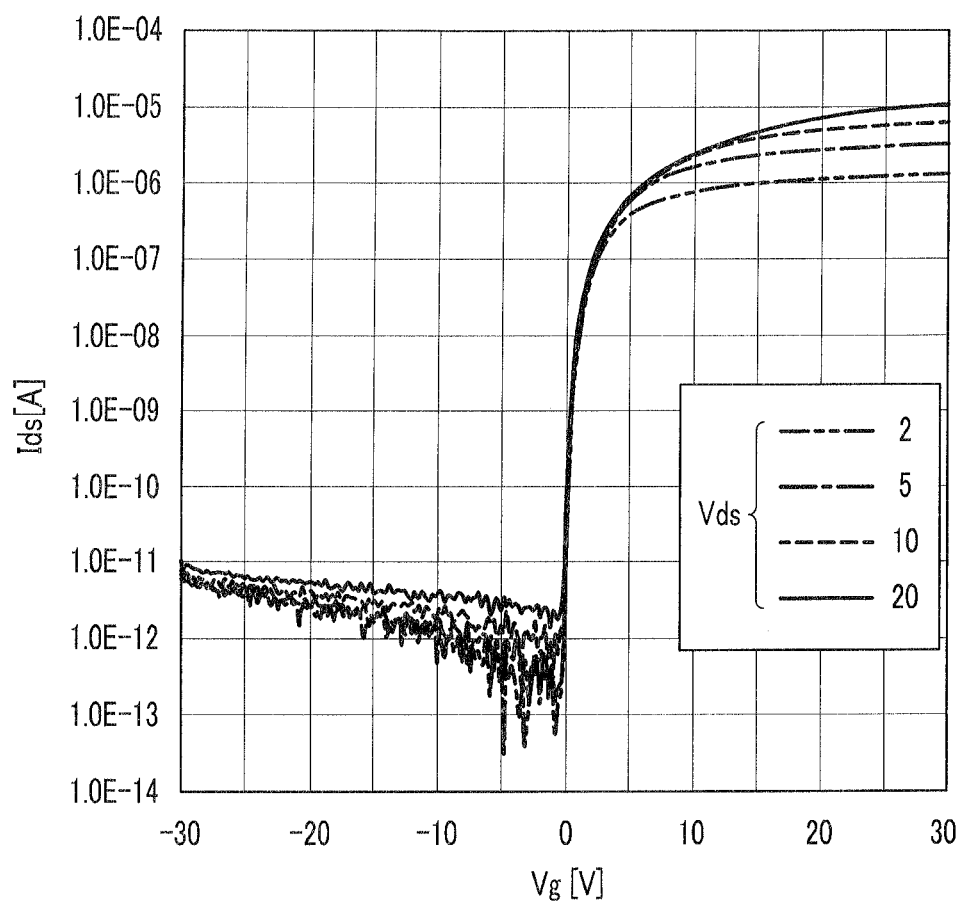
FIG. 22 is a graph illustrating a voltage-current characteristic according to various source-drain voltages of a thin film transistor according to an exemplary embodiment of the present invention.

FIG. 21 is a graph illustrating a voltage-current characteristic of a thin film transistor according to an exemplary embodiment of the present invention, and FIG. 22 is a graph illustrating a voltage-current characteristic according to various source-drain voltages of a thin film transistor according to an exemplary embodiment of the present invention.

Referring to FIG. 21, an on/off transition of the source-drain current (Ids) according to the gate electrode voltage (Vg) in a thin film transistor Q according to an exemplary embodiment of the present invention is distinctly identified at a threshold voltage, and an ON current is relatively high, which means that the characteristics of the thin film transistor Q as a switching element are improved.

Referring to FIG. 22, a thin film transistor Q according to an exemplary embodiment of the present invention experiences no or little change in the threshold voltage according to a change in the source-drain voltage (Vds), such that the thin film transistor Q may maintain uniform characteristics as a switching element.

As described above, according to the exemplary embodiments of the present invention, the gate electrode 154 and the source region 133 of the thin film transistor Q or the gate electrode 154 and the drain region 135 of the thin film transistor Q do not overlap or substantially do not overlap each other such that the parasitic capacitance between the gate electrode 154 and the source region 133 or the parasitic capacitance between the gate electrode 154 and the drain region 135 may be decreased. Accordingly, the ON current and the mobility of the thin film transistor may be increased and the on/off characteristics of the thin film transistor Q as a switching element may be improved. As a result, a display device with the thin film transistor may have a reduced RC delay. Accordingly, the thickness of the driving signal lines may be decreased, thus resulting in savings in manufacturing costs. Further, the characteristics of the thin film transistor itself are improved, resulting in a reduced size of the thin film transistor and an increased margin for forming a minute channel.

While the embodiments of the invention have been described, it is to be understood that the invention is not limited to the disclosed embodiments, but on the contrary, is intended to cover various modifications and equivalent arrangements included within the spirit and scope of the appended claims.

What is claimed is:

1. A thin film transistor comprising:
a channel region including an oxide semiconductor;
a source region and a drain region respectively connected to two opposite sides of the channel region, wherein the source region and the drain region face each other;
an insulating layer on the channel region;
a gate electrode on the insulating layer;
a passivation layer on the gate electrode; and
a data input electrode and a data output electrode on the passivation layer, the data input electrode connected to the source region, the data output electrode connected to the drain region,
wherein an edge of the gate electrode is aligned or substantially aligned with an edge of the channel region, and wherein the data output electrode is in a same layer as a pixel electrode for displaying an image.

2. The thin film transistor of claim 1, wherein the source region and the drain region include a reduced material of the channel region.

3. The thin film transistor of claim 2, wherein the edge of the gate electrode is aligned or substantially aligned with an edge of the insulating layer.

4. The thin film transistor of claim 1, wherein the passivation layer directly contacts a side surface of the insulating layer.

5. A thin film transistor array panel comprising:
an insulation substrate;
a channel region on the insulation substrate, the channel region including an oxide semiconductor;
a source region and a drain region respectively connected to two opposite sides of the channel region, wherein the source region and the drain region face each other;
an insulating layer on the channel region;
a gate electrode on the insulating layer;
a passivation layer on the gate electrode; and a data input electrode and a data output electrode on the passivation layer, the data input electrode connected to the source region, the data output electrode connected to the drain region, wherein an edge of the gate electrode is aligned or substantially aligned with an edge of the channel region, and wherein the data output electrode is in a same layer as a pixel electrode for displaying an image.

6. The thin film transistor array panel of claim 5, wherein the source region and the drain region include a reduced material of the channel region.

7. The thin film transistor array panel of claim 6, wherein the edge of the gate electrode is aligned or substantially aligned with an edge of the insulating layer.

8. The thin film transistor array panel of claim 7, further comprising a buffer layer between the insulation substrate and the channel region.

9. The thin film transistor array panel of claim 8, wherein at least one of the buffer layer or the insulating layer includes an insulating oxide.

10. The thin film transistor array panel of claim 5, wherein the passivation layer directly contacts a side surface of the insulating layer.

11. A thin film transistor comprising:
a substrate;
a semiconductor pattern including a source region, a drain region, and a channel region between the source region and the drain region;
a gate electrode on the semiconductor pattern;
a passivation layer on the gate electrode; and
a data input electrode and a data output electrode on the passivation layer, the data input electrode connected to the source region, the data output electrode connected to the drain region,
wherein the gate electrode overlaps the channel region but does not overlap the source region or the drain region; and
the data output electrode is in a same layer as a pixel electrode for displaying an image.

12. The thin film transistor of claim 11, further comprising a light blocking film between the substrate and the semiconductor pattern, wherein the semiconductor pattern overlaps the light blocking film.

13. The thin film transistor of claim 11, wherein the passivation layer directly contacts a side surface of the insulating layer.

* * * * *